United States Patent
Kolics et al.

(10) Patent No.: US 6,794,288 B1
(45) Date of Patent: Sep. 21, 2004

(54) METHOD FOR ELECTROLESS DEPOSITION OF PHOSPHORUS-CONTAINING METAL FILMS ONTO COPPER WITH PALLADIUM-FREE ACTIVATION

(75) Inventors: Artur Kolics, San Jose, CA (US); Nicolai Petrov, Santa Clara, CA (US); Chiu Ting, Saratoga, CA (US); Igor C. Ivanov, Dublin, CA (US)

(73) Assignee: Blue29 Corporation, Sunnyvale, CA (US)

( * ) Notice: Subject to any disclaimer, the term of this patent is extended or adjusted under 35 U.S.C. 154(b) by 0 days.

(21) Appl. No.: 10/345,134

(22) Filed: May 5, 2003

(51) Int. Cl.[7] .............................................. H01L 21/44
(52) U.S. Cl. .............. 438/678; 438/687; 438/FOR 358; 438/FOR 390; 257/E23.145
(58) Field of Search ................................ 438/678, 687, 438/FOR 390, FOR 358; 427/304, 437; 257/E23.145

(56) References Cited

U.S. PATENT DOCUMENTS

| | | | |
|---|---|---|---|
| 4,002,778 A | 1/1977 | Bellis et al. | |
| 4,642,161 A | 2/1987 | Akahoshi et al. | |
| 5,614,003 A | * 3/1997 | Mallory, Jr. | ............... 106/1.22 |
| 5,695,810 A | 12/1997 | Dubin et al. | |
| 5,750,087 A | 5/1998 | Corella | |
| 6,479,384 B2 | 11/2002 | Komai et al. | |
| 6,486,055 B1 | 11/2002 | Jung et al. | |
| 2002/0064592 A1 | * 5/2002 | Datta et al. | ................... 427/98 |
| 2002/0084529 A1 | 7/2002 | Dubin et al. | |
| 2003/0113576 A1 | 6/2003 | Chebiam et al. | |
| 2003/0134047 A1 | 7/2003 | Dubin et al. | |

FOREIGN PATENT DOCUMENTS

JP          09-307234          11/1997

* cited by examiner

Primary Examiner—George Fourson
Assistant Examiner—Thanh Pham
(74) Attorney, Agent, or Firm—Mollie F. Lettang; Conley Rose P.C.

(57) ABSTRACT

The method for selective deposition of Co—W—P system films onto copper with palladium-free activation consists of creating hydrogen-rich complexes on the metal surface prior to deposition. More specifically, the method consists of creating the aforementioned complexes on the copper surfaces prior to electroless deposition of a Co—W—P system films. This is achieved by contacting the copper surface with reducing agents for a short period of time and under an elevated temperature. Such reducing agents comprise a hypophosphorous-acid-based or borane-based reducing agents such as dimethylamine borane. Hypophosphorous acid is preferred since it is more compatible with the electroless deposition solution.

27 Claims, 1 Drawing Sheet admolecules adhydroxyl introduced atoms of oxygen

METHOD FOR ELECTROLESS DEPOSITION OF PHOSPHORUS-CONTAINING METAL FILMS ONTO COPPER WITH PALLADIUM-FREE ACTIVATION

FIELD OF THE INVENTION

The present invention relates to the field of electroless deposition, in particular to a method for electroless formation of phosphorus-containing metal films, such as cobalt-tungsten-phosphorus (hereinafter referred to as Co—W—P) system films on copper substrates with Pd-free activation. Such coatings may find application in semiconductor manufacturing where properties of deposited films and controllability of the composition and of physical and chemical characteristics of the deposited films may be critically important. More particularly, the present invention may find application in processes for fabricating semiconductor devices using a trench wiring technique, such as damascene processes, or the like.

BACKGROUND OF THE INVENTION

Electroless deposition is a process for depositing a thin layer or layers of a material or materials onto a substrate, which normally consists of immersing the substrate in a deposition bath that contains ions of the material to be deposited, whereby some of these ions precipitate onto the surface of the substrate. In contrast to electroplating processes, the electroless deposition process does not need an externally applied electric field to facilitate the deposition process. An advantage of an electroless deposition process is that it can be selective, i.e., the material can be deposited only onto areas that demonstrate appropriate electrochemical properties. Therefore, local deposition can be performed more effectively onto metals that exhibit an affinity to the material being deposited or onto areas pretreated or pre-activated, e.g., with a catalyst. The material or catalyst applied prior to deposition onto the selected areas is sometimes called a "seed material" or "seed layer" and the ratio of the deposition rate on the activated regions to the deposition rate at the non-activated regions is known as the "deposition process selectivity". It is understood that the deposition rate may also depend on such characteristics of the activated areas, as dimensions, profiles of the exposed surfaces, and distances between the portions of the areas to be activated. For many applications, it is very important to provide deposition of uniform thickness. Other important characteristics of the electroless deposition are selectivity of the process and adherence of the deposited layer to the substrate.

Electroless deposition of various metals from deposition solutions onto catalytically pretreated surfaces has been widely used in the past in the printed circuit board industry for the production of wiring layers and interlayer connections. Later, a similar technique was transfered to semiconductor industry for the production of metal interconnects in semiconductor (IC) chips. The electroless deposition technique is advantageous to other known metal deposition techniques such as different types of sputtering and evaporations. One advantage is the use of less expensive equipment. Another advantage is selectivity and controllability of the process. For example, deposition can be performed only onto pretreated areas. As a result, it becomes possible to reduce the number of lithographic and etching steps, which are the most expensive stages of the semiconductor manufacture. Another advantage is that electroless deposition well matches the present trend for using copper as interconnect materials instead of aluminum, suicides, or the like. It is well known that the new generations of LSI are associated with the use of copper, which possesses very high electrical conductivity. The problem encountered by traditional techniques (that include anisotropic etching) in transfer to copper is that copper is difficult to etch anisotropically. Yet another advantage of electroless deposition is that it to a lesser degree depends on such features of the substrate surface as angles or depth of trenches and vias, etc. This property enables deposition into deep via holes on substrates that could not be uniformly covered by sputtering and evaporation.

Many surface activation techniques that precede electroless deposition are known in the art. The most common applications of electroless deposition to integrated circuit manufacturing comprise deposition of nickel, cobalt, palladium, or copper onto one of two types of substrate surfaces. The first type of substrate surface comprises conductive regions of substrates that are generally formed of silicon, aluminum, or aluminum alloys. The second type of substrate comprises a non-conductor such as silicon dioxide or a polymeric insulator. The reported surface activation techniques applied to these substrates usually fall into one of four categories: (1) catalyst film deposition by evaporation or sputtering, (2) catalyst film deposition by electrochemical or chemical surface modification, and (3) catalytic film deposition from a colloidal suspension; (4) photon-enhanced activation by laser or wide spectrum irradiation.

Metals of Group VIII (e.g., palladium and platinum) are frequently used as catalytic surface activators in electroless deposition methods. Catalytic films of palladium or platinum for subsequent electroless deposition can be readily deposited by evaporation or sputtering techniques. The films deposited with these techniques can be patterned by well-known lithographic techniques, e.g., subtractive etching or liftoff. Large features and/or dense patterns of small features are relatively easy to plate with this method.

It has been found out that in electroless deposition, palladium activation from an aqueous solution demonstrates higher catalytic activity of films than of palladium films deposited by sputtering or evaporation (see U.S. Pat. No. 6,180,523 issued in 2001 to Chwan-Ying Lee, et al.). The reduced catalytic activity results in the formation of a less uniform films. Furthermore, it becomes more difficult to deposit a film on small and isolated features such as metallization patterns on semiconductor devices.

There are known various methods suitable for improving catalytic activity of the surface with the use of palladium prior to electroless deposition.

As has been mentioned above, copper is not easily dry-etched. Therefore, in the formation of a copper wiring, a process of forming a trench wiring is promising. The trench wiring is produced by a process in which a predetermined trench is preliminarily formed in an interlayer dielectric comprised of, for example, silicon oxide, and the trench is plugged with a wiring material. Then, the excess wiring material is removed by, for example, a chemical mechanical polishing (hereinafter, frequently referred to simply as "CMP") process, to thereby form a wiring in the trench.

The copper wiring is generally used in the form of a multilayer wiring. When such a multilayer copper wiring is formed, no barrier film, which prevents copper from diffusing, is present on the surface of the copper wiring. Therefore, before an upper layer wiring is formed on the copper wiring, as a diffusion-preventing film for copper, a barrier film comprised of silicon nitride, carbon nitride or the like is formed on the copper wiring. Silicon nitride, silicon carbide, and silicon oxynitride have relative dielectric constants larger than that of silicon oxide. Therefore, it is considered that these are advantageous in a method in which the surface of copper after the CMP process is selectively coated with these. In addition, U.S. Pat. No. 5,695,810 issued to V. Dubin, et al. on Dec. 9, 1997 discloses a method in which the surface of copper is coated with a cobalt tungsten phosphorus (Co—W—P) film. In this method, cobalt tungsten phosphorus is deposited by an electroless plating method using the surface of copper as a catalyst.

A disadvantage of the above method is that it offers deposition of a Co—W—P barrier layer onto copper using copper as a catalyst without additional activation. Such a process is characterized by a low deposition rate, which could be improved with the use of catalytic activation.

Further, Japanese Patent Application Laid-Open Specification No. 9-307234 filed by Yo. Funada, et al., on May 20, 1996 (which is one of basic applications of U.S. Pat. No. 5,830,563) discloses a method used in a printed-wiring substrate, in which the exposed copper surface is subjected to palladium displacement plating, and electroless plating is conducted using the displaced palladium as a catalyst nucleus. On the other hand, as a catalyst activation treatment for electroless plating, a method in which palladium ions are reduced utilizing an oxidation reaction of tin ions, a method using a palladium sol, a method using a silane coupling agent, and the like are known.

However, the catalytic activity of copper to oxidize a reducing agent is lower than that of gold (Au), nickel (Ni), palladium (Pd), cobalt (Co), or platinum (Pt). Therefore, in the electroless plating method using a hypophosphite as a reducing agent, when a metal having an ionization potental larger than that of copper is electroless-plated on copper, a unfavorable phenomenon such that plating cannot be conducted at all, the plating cannot be conducted uniformly, the plating rate is low, or the like is likely to occur.

In addition, in the palladium catalyst method used in a general electroless plating, it is known that palladium is present in an island form on the entire surface of both a copper wiring and in many cases on an interlayer dielectric film. In this case, a barrier layer comprised of cobalt tungsten phosphorus is formed by deposition using, as a catalyst nucleus, the palladium formed in an island form on the entire surface of copper wiring and, in many cases, on the surfaces of interlayer dielectric films, especially on those formed by high carbon content materials. However, typically palladium is present as a plurality of separate nucleation sites, especially on the surface of polycrystalline materials, such as copper. Therefore, the barrier layer, which grows using such palladium as a nucleus, is likely to be also a non-uniform film. In addition, for forming the barrier layer as a continuous film on the entire surface of both the copper wiring and the interlayer dielectric film, it is necessary to increase the thickness of the barrier layer, and the thickness depends on the density of the palladium formed in an island form. Such problems make it difficult to control the process.

Further, in the aforementioned known palladium catalyst methods, it is difficult to selectively form a palladium catalyst layer on the copper wiring, and thus, palladium elements disadvantageously adsorb onto the entire surface to be treated. In addition, in the palladium catalyst method using tin ions, it is confirmed that tin elements are drawn into the palladium layer, and problems are encountered in that tin causes the wiring resistance to rise and the long-term reliability of the wiring to be poor.

Attempt has been made to solve the above problems by a method disclosed in U.S. Pat. No. 6,479,384 issued on Nov. 12, 2002 to Naoki Komal, et al. This patent describes a process for fabricating a semiconductor device by forming on a copper wiring a barrier layer, which functions as a diffusion-preventing film. A catalytic metal film, which serves as a catalyst in the electroless plating method, is selectively formed on the copper wiring by a displacement deposition method using a displacement deposition solution at a temperature about 30° C., and the barrier film is selectively formed on the catalytic metal film by electroless plating. The purpose of the aforementioned invention is to selectively and uniformly carry out the catalytic activation on the surface of the metal wiring made of copper or a copper alloy by using palladium so as to improve reliability of the wiring and plating property of the electroless plating method using a hypophosphite as a reducing agent. More particularly, the aforementioned process is intended for fabricating a semiconductor device using a trench wiring technique, such as a dual Damascene process or a single Damascene process.

U.S. Pat. No. 6,486,055 issued in 2002 to Chan-Hwa Jung, et al. discloses a method for forming copper interconnections in semiconductor component using electroless plating system, which enables copper to be grown only in corresponding interconnection regions. In such a method, a wafer is cleaned and pretreated with a palladium seed solution so as to cause spontaneous catalytic activation, and simultaneously the process temperature is varied to grow metal seed particles from the metal seed pretreating solution. The wafer is cleaned to remove the metal seed from the wafer surface, and the wafer is finally plated with an electroless plating bath to grow copper in the metal seed formed regions. This method simplifies the processes and reduces process costs by substituting a wet process for the existing vacuum pretreating process. Also, a wafer planarization process can be omitted by selectively growing copper only in desired interconnections. Compared with the existing ultraviolet radiation photolithography process, the selective copper growth process of the method has an advantage of relative simplicity.

In all methods described above the catalytic activation of the surface to be treated is based on the use of palladium. However, activation of semiconductor substrate surfaces with palladium has a number of disadvantages which are the following: 1) palladium is a very expensive material and therefore the use of palladium makes the entire process expensive; 2) palladium is not a readily available material and in commercial quantities is available only from one country; 3) palladium activation is carried out by deposition of palladium; however, at the initial stage of deposition palladium precipitates in the form of islands, which are growing simultaneously in three directions with noncontrollable growth; this results in the formation of rough surfaces on the subsequent stages of deposition; 4) since palladium possesses low selectivity, it may be easily absorbed by the polymeric surface (low-K polymers) that may surround the copper area onto which palladium is precipitated.

U.S. Pat. No. 4,002,778 issued in 1977 to H. Bellis et al. describes a process of electroless deposition of nickel or cobalt onto conductive substrates without the use of palladium as a seed layer. However, the solution offered by the authors contains salts of alkali-metal salts, which are extremely undesirable for use in semiconductror devices.

SUMMARY OF THE INVENTION

It is an object of the present invention to provide a method for selective deposition of Co—W—P system films onto copper with palladium-free activation. It is another object to provide the aforementioned method in which efficiency of selective deposition of a Co—W—P system films is achieved by forming a hydrogen-rich aquacomplexes on the metal surface prior to deposition. Another object is to provide the aforementioned method as simple and inexpensive. Still another object is to provide the aforementioned method, which excludes an additional step of palladium deposition.

The method for selective deposition of Co—W—P system films onto copper with palladium-free activation consists of creating hydrogen-rich complexes on the metal surface prior to deposition. More specifically, the method consists of creating the aforementioned complexes on the copper surfaces prior to electroless deposition of a Co—W—P system films. This is achieved by contacting the copper surface with reducing agents for a short period of time and at an elevated temperature. Such reducing agents comprise a hypophosphorous-acid-based or borane-based reducing agents such as dimethylamine borane. Hypophosphorous acid is preferred since it is more compatible with the electroless deposition solution.

DETAILED DESCRIPTION OF THE INVENTION

Figure 1A:
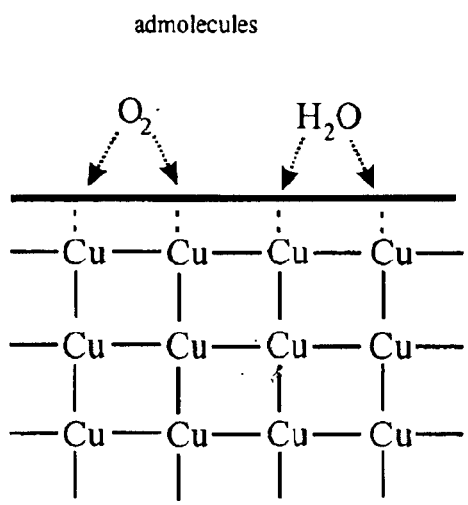
FIG. 1A is an alleged structure illustrating formation of an ion of molecular oxygen in ionosorption, in particular, for the case of interaction between the copper surface and atmospheric air in the presence of water.

It is known that electroless deposition occurs only on a surface that is catalytic to the deposition reaction. When the surface lacks catalytic activity, special surface treatment is needed prior to the deposition process. The usual pretreatment protocol includes surface activation or sensitization and activation steps. In particular, the Cu surface after Chemical Mechanical Polishing process is not catalytic to a process of hypophosphite-based electroless deposition of cobalt phosphorous and cobalt tungsten phosphorous alloys. This may be due to the fact that the copper surface is terminated by oxygen (oxides text will dissolve in acids, but only in a hypophosphorous acid will the copper surface be prevented from oxidation in deionized water or in air either by adsorbed hydrogen or by copper hydride) that penetrates into the surface layer of copper. Therefore, an electroless deposition bath, such as the one providing a phosphorous-containing metal film, e.g., Co—W—P system film, cannot be used without activating the copper substrate first with palladium. While in the general practice the use of palladium does not impose any significant limitation on the process, the application of palladium in semiconductor fabs is not recommended for the reasons described above and due to contamination threat. Therefore processes of activation without the use of palladium are highly desirable.

For better understanding of the present invention, it would be advantageous to consider some theoretical principles and mechanisms participating in the deposition of Co—W—P films onto copper surfaces, in particular with respect to the deposition processes with activation and without activation, and more specifically with respect to palladium as an activating agent.

Although the following description will refer only to palladium, it is appreciated that the same principles are applicable to other transient metals of the eighth group of the periodic table of elements, such as nickel, platinum, etc. Furthermore, although the following description relates mainly to cobalt-tungsten-phosphorus films, it is appreciated that the principle of the invention is applicable to other phosphorus-containing metals.

It is known that palladium strongly absorb some gases, in particular hydrogen. In other words, palladium is to a significant degree penetrable to hydrogen. As palladium is saturated with hydrogen, its electrical conductivity is reduced. Flow of electric current through a palladium conductor saturated with hydrogen causes movement of hydrogen atoms along the conductor. This phenomenon allows us to assume that hydrogen atoms in palladium exist at least partially in a free-electron state, which is similar to metallic. Depending on pretreatment of the metal surface, rate of dissolution of hydrogen in palladium may be a function of gas pressure. In some cases, rate of dissociation of hydrogen molecules, adsorbed by the metal surface, into atoms depends on time, in other cases—on the speed of penetration of the generated hydrogen atoms into the metal. X-ray analysis shows that absorption of hydrogen does not change the crystalline structure of palladium. Thus, it can be concluded that activation of a copper film surface with palladium increases content of hydrogen in reducing aqueous solutions that may be contained in such films, i.e., in such solutions as hypophosphite ($H_3PO_2$) solutions. It is also known that normally the surface of copper is oxidized, and a degree of this oxidation depends on such factors as the time of exposure to air, presence in the steams or other chemically-active gases or aerosols. When chemical deposition is performed onto such surface, in particular deposition of transient metals, an intermediate oxidized layer will be formed on the interface between the copper and the coating film, i.e., an actual interface will consist of "copper-oxygen-deposited metal". It is obvious that such a structure will significantly impair properties in the deposited film. In view of the above properties, if palladium is applied onto a surface, during deposition it will immediately begin to absorb hydrogen from reducing solutions and thus will enhance diffusion of hydrogen into the copper surface. As a result, the copper will be reduced from the oxidized state with reverse diffusion of reduction products, in particular, water, whereby a strong "metal-metal" bond will occur on the basis of solid solutions, which in our case corresponds to Cu—Co, Co—W, and Cu—Pd.

Ions capable of activating molecules of hydrogen in an aqueous solution almost always have a $d^8$–$d^{10}$ electron structure with completely or almost completely populated d-orbitals, while ions of other electron structures are inactive. As can be seen from some examples of Table 1 given below, affinity of a metal ion to an electron increases with an increase in the charge of the nucleus and reaches its maximum when the d-orbital is completely or almost complete populated. In any period of the periodic system, the highest catalytic activity belongs to those metals, which have maximal electron affinity. In ions with the $d^{10}$ electron shell, under the effect of thermal energy, electrons can easily transfer from the upper d-level to the upper s-level. This is because the d-level is highly populated and because wide d- and s-levels are partially overlapped. This local association may occur under effect of a crystalline field or ligand fields, i.e., polar or charged groups which may be formed in compounds of the aforementioned metals.

TABLE 1

| Cation | Formulae of the outer electron shells | Metals with similar outer electron shell structures |
|---|---|---|
| $Cu^{2+}$ | $3d^9 4s^0$ | Co ($3d^7 4s^2$) |
| $Cu^+$ | $3d^{10} 4s^0$ | Ni ($3d^8 4s^2$) |
| $Pd^{2+}$ | $4d^8$ | Ru ($4d^7 5s^1$) |
| $Ag^+$ | $4d^{10}$ | Pd ($4d^{10}$) |
| $Hg^{2+}$ | $5d^{10}$ | Pt ($5d^9 6s^1$) |

Energy of such a system can be reduced if ligands are connected with predetermined orientation in accordance with spatial arrangement of d-orbitals. In general, the greater is the energy difference in standard states of d- and s-levels, the harder is the electron transfer and the lower is the electron affinity. The higher is the nucleus charge, the greater is the aforementioned energy difference between the levels. In an aqueous solution, however, ions are coordinated with molecules of water, whereby the following two effects occur: metal ions may accept electrons, while coordinated molecules of water, similar to bases, may accept protons $H^+$. In this case, selectivity of the system depends on the degree of metal oxidation.

The applicants have found a new method of metal deposition without using Pd or other additional metals as an activator, which is applicable for all hypophosphite-based systems including electroless deposition solution for Co—W—P layer formation. Furthermore, the applicants showed that their method is able to maintain the selectivity of Co—W—P deposition, which is a critical requirement in interconnect applications.

In preparatory inorganic and organic chemistry, copper is often used as a catalyst. Copper and copper compounds are both characterized by catalytic properties. Copper compounds are often used as oxygen carriers, e.g., for oxidation of organic compounds. Copper may also catalytically accelerate reduction processes.

According to generally accepted classification, acidic centers of two types may exist on the surface of copper in aqueous solutions, i.e., Lewis acidic centers and Brönsted acidic centers. Lewis acidic centers have better electron affinity, while Brönsted acidic centers show a tendency to donating protons. In the presence of water, acidic centers of these two types may transfer from one to other:

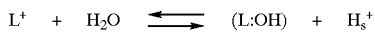

When such a center reacts on a surface as a proton, the center divides the electron pair with an ion of $OH^-$, while the remaining free proton $H_s^+$, which is adsorbed on the surface, is ready to participate in a chemical reaction. In other words, in the manner described above, the Lewis-type activity can transfer to the Brönsted-type activity. Depending on a degree of oxidation of catalytic centers of copper, electroless deposition of transient metals and phosphorus should progress not only quantitatively, but also selectively. For example, it is desirable that deposited films should have good adhesion to each other and should contain the least possible amount of impurities. Therefore the surface of copper should not only be catalytically active, but should also be clean and without noticeable traces of oxides.

In the surface layers of a copper film, atoms assume positions different from those in a continuous part of the spatial lattice structure. This is because movements of atoms on the surface are limited only from three sides and therefore a small shift of the atoms in the directions normal to the surface or in the direction parallel to the surface may occur at the expense of relatively small energies. Since configuration of links between the atoms in the surface layer is different from that for atoms in the inner structure, even small dislocation of a lattice node may lead to a significant increase in the binding energy. This means that such movement of atoms on the surface may lead to a decrease in the system energy and may impart to the system ability of oxidation. Release of a clear surface from its equilibrium always occurs towards the inner part of the crystal. This phenomenon reflects an increase in interaction of the surface atoms with atoms of a substrate. As a result of movement of the surface atoms that accompanies electronic transitions, energy of non-occupied levels increases relative to the energy of occupied levels. One extreme case of binding of an adsorbate is ionosorption. In this case, free electrons are caught or injected by a surface group. Such a process of electron transfer appears to be the only process in which the energy is released or consumed. A foreign adsorbed atom or molecule is ionized, while oppositely-charged ions may be located hundreds of Angstroms from the adsorbed ions, so that an interaction between their electrons as in a covalent bond is impossible.

FIG. 1A illustrates formation of an ion of oxygen in a sorption process, in particular, for the case of interaction between the copper surface and atmospheric air in water.

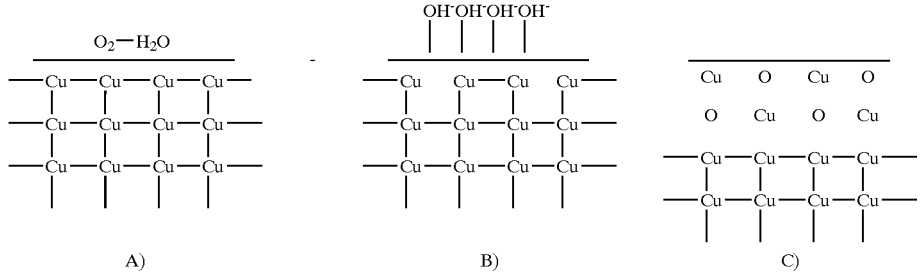

A)  B)  C)

Known in the art are semi-quantitative models, in which an electron is first removed from a solid body and is placed onto a foreign atom, and then the thus-formed ion is brought close to the surface of the solid body. In another extreme case, adsorption of foreign atoms and molecules occurs with participation of only locally-acting forces, i.e., with the formation of a purely-covalent bond. In such a process, there is no electron exchange between an adsorbate and a solid body, and a purely chemical bond is formed.

Figure 1B:
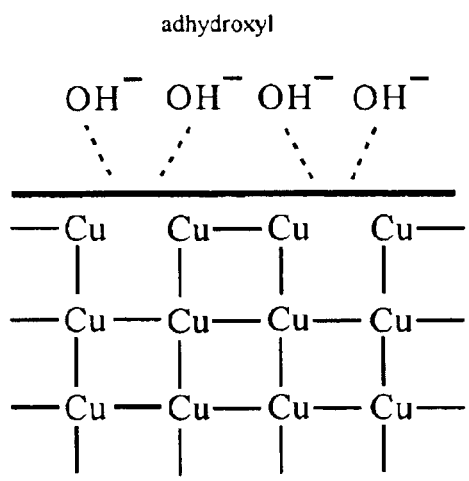
FIG. 1B is an alleged structure illustrating how hydroxyl groups are adsorbed on the copper surface forming local bonds with surface atoms.

FIG. 1B illustrates how hydroxyl groups adsorbed on the copper surface form local bonds with surface atoms. In this case, adsorption is determined mainly by a covalent chemical bond. However, the strength of the bond to some extent depends on collective properties of the electrons (Fermi energy). Therefore this mechanism of adsorption cannot be classified as a pure local chemical bonding. Nevertheless, local interaction between an adsorbed atom and the surface still may (as in the case of molecules of water) be caused by dipole-dipole attraction. Local bonding may occur under the effect of the crystalline field or ligand fields of complexes. In adsorption of large complex molecules, strength of bonding strongly depends on correlation between the lattice constant and the length of intermolecular links in the adsorbate.

Figure 1C:
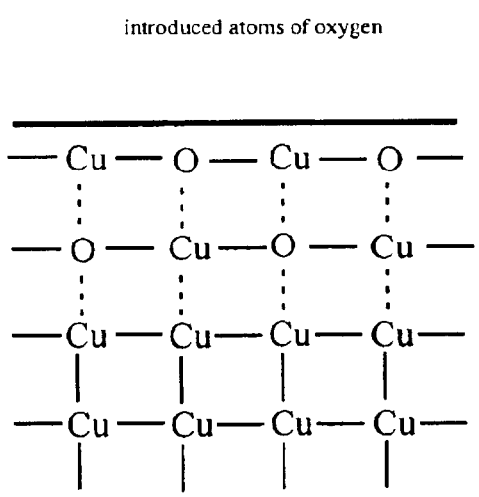
FIG. 1C is an alleged structure illustrating penetration of oxygen into the crystallographic lattice of copper.

An interaction between foreign atoms and a solid body surface occurs with the formation of a new phase (see FIG. 1C). A good example of such an interaction is oxidation of copper. It is rather difficult to determine when the adsorbed oxygen begins to transfer to phase of a surface oxide, especially if movement of solid-body atoms has to be considered only as a part of a process for the formation of a second phase, usually, copper monoxide.

An artificially obtained copper monoxide $Cu_2O$ is yellow in color and has a structure of a finely dispersed gel. Coarsening of particles turns them red. Copper monoxide is practically insoluble in water. However, addition of any complexing agent makes it possible to easily dissolve it. Therefore in this case in the initial period of interaction of the copper monoxide, which consists mainly of cuprous oxide $Cu_2O$ and possibly of small amounts of cupric oxide CuO, which has covalent chemical bonds, one cannot observe a noticeable amount of ions of $Cu^+$ and $Cu^{2+}$ in the solution. However, small quantities of copper ions can still be formed in the above solutions after the formation of salts of phosphoric acids in the course of appropriate reactions.

Having described some theoretical approach, let us consider the main principles of the method of the invention.

The essence of the invention consists of converting the surface copper oxides to Cu through a vigorous reduction reaction. This can be achieved by contacting the copper surface with reducing agents such as hypophosphorous-acid-based or borane-based reducing agents such as dimethylamine borane heated to a temperature within the range of 20° C. to 100° C. for a period of 0–1 hour. Hypophosphorous acid is preferred since it is more compatible with the phosphorus-based electroless deposition solutions.

In an intensive adsorption that occurs in the initial stage of interaction of copper with water, which is a very strong adsorbate, water forms on the copper surface hydroxyl groups $OH^+$. This, in turn, may have a profound effect on chemical and electronic properties of the material. There is not much adsorbed water on the clean surface of a copper film. However, after the first oxide layer is formed, water is attracted with the formation of complexes.

On the other hand, it is obvious that a predominant amount of copper Ions should be associated with the existence on the film of surface centers, which may be either contaminated by oxygen of air with the formation of oxides or reduced to its initial activity in reducing solutions. They also may gain their activity due to formation of a coordination field of aquacomplex ligands:

-continued

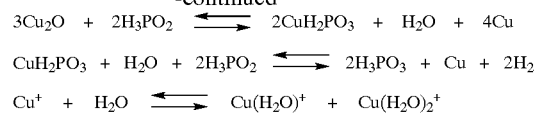

Hypophosphite, which is used as a reducing agent in processes of chemical deposition, forms only one row of salts: hypophosphate $M^1H_2PO_2$. Phosphorous acid $H_3PO_3$ forms two rows of salts poorly soluble in water: monosubstituted $M^iH_2PO_3$ and bisubstituted $M^{ii}H_2PO_3$ phosphates. One can therefore assume that $H_3PO_3$ contains one atom of hydrogen directly bonded to phosphorus. Copper phosphites $Cu^{(I)}H_2PO_3$ and $Cu^{(I)}_2H_2PO_3$ are poorly soluble in water, and therefore during recovery of copper the solution should be maintained at a relatively high temperature (>85° C.).

It can be assumed that concentration of phosphorous acid $H_3PO_3$ in the solution is insignificant and that it plays a role of an intermediate compound, while existence of an orthophosphoric acid $H_3PO_4$ is unlikely at all due to strong reducing properties of $H_3PO_2$.

Let us consider why in the method of the invention, there is a very low probability for the formation of a copper hydride CuH on the surface of a copper film in the presence of a hypophosphorous acid solution. It is known from practice that if an aqueous solution that contains 2 moles of $H_3PO_2$ per 1 mole of a bivalent copper salt is heated to 40–50° C., it will yield a redgraying precipitate that consists of an extremely unstable copper-hydrogen compound. In a wet state, this precipitate is prone to oxidation, even at a low temperature. Heating in air causes ignition, and the hydrogen burns out. Normally such a compound is expressed as CuH. A pure water-free copper hydride CuH can be obtained by reacting copper iodide with a lithiumaluminum hydride in an etherpyridine solution. It comprises a light red-brown solid substance which is dissoluble in pyridine. Anhydrous copper hydride has better stability than a water-containing copper hydride and possesses a noticeable hydrogenating action. It should be noted that the copper hydride has a covalent bond, i.e., in this case the degree of oxidation is close to zero. This means that formation of copper hydride CuH occurs in the presence of $Cu^{2+}$ ions. Similarly, the presence of $Cu^{2+}$ ions causes heterolythic dissociation of molecules of hydrogen:

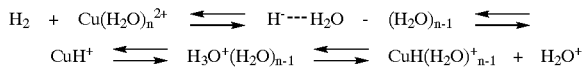

It is known, however, that if an aqueous solution of a bivalent copper salt is affected by metallic copper, a significant part of copper ions present in the solution is converted into a monovalent state. In spite of this, the solution does not contain any noticeable quantities of $Cu^+$ ions, as the monovalent copper is contained in the solution almost without residue in the form of an anionic complex.

As follows from the reactions shown above, the surface of copper is freed from oxygen due to redox processes that occur in the $H_3PO_2$ solution. A question arises—what will happen with copper after it is completely reduced to metal?

It can be assumed that in the process of the invention directly around the metal the conditions are balanced.

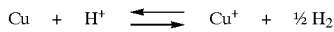

However, this equilibrium is so much shifted to the left that noticeable dissolving of copper and emission of hydrogen are not observed. Significant shift of the equilibrium to right can be caused by creating conditions that cause either decrease in concentration of $Cu^+$ ions, which are present in the solution only in minimal quantities, or by removing from the solution hydrogen, which is contained there in minimal quantities. The first condition can be achieved by reducing $Cu^+$ ions with the use of a strong reducing agent ($H_3PO_2$):

In the initial moment hydrogen can be removed due to diffusion into the solvent. It is obvious that the aforementioned reaction is quickly saturated, and atoms of surface layers are surrounded by shells which consist of ligands of copper complexes $Cu(H_2O)^+$, $Cu(H_2O)_2^+$ saturated with free hydrogen.

At the moment of its evolvement, hydrogen can reduce hypophosphorous acid $H_3PO_2$ in an aqueous solution up to phosphorous hydrogen $PH_3$. However, the acid itself is a strong reducing agent. As has been shown above, it shows a specific behavior relative to solutions of bivalent copper salts, i.e., it causes precipitation of copper hydride from these salts, while the phosphorous acid $H_3PO_3$ causes precipitations of metallic copper (and only with boiling).

A layer remains on the surface since it is not soluble in an aqueous solution. After this activation step a brief deionized water wash can be applied to remove the acid, but immediately after that a hot electroless deposition solution should be applied onto the activated copper surface. The rinse time should preferably vary between 0 sec. to 1 hour, preferably from 0 to 10 sec. in order to avoid the reoxidation of the surface layer.

Since the exact mechanism of Cu surface stabilization against oxidation in aqueous solution is still unknown, the authors also consider another mechanism of Cu surface stabilization and conversion to a higher catalytic state through actual formation of a metastable copper hydride in the presence of a reducing agent (e.g., hypophosphoric acid) within a boundary layer which remains stable during hypophosphoric acid pretreatment and subsequent water rinse. Furthermore, adsorption of water molecules after the drying process step can further stabilize the formed copper hydride layer thus making such multistep process suitable for production.

The advantage of the outlined activation process is that it does not pose any contamination effect, i.e. hypophosphite is used in the electroless bath anyway, no additional layer is formed between the copper and the electrolessly deposited layer, and finally the threat of bath poisoning is avoided since hypophosphorous acid is compatible with the electroless deposition bath. Further advantage of this activation process is its selectivity to copper. Specifically, no deposition of Co—W—P layer will occur on dielectric that is situated between copper features.

Let us now consider interaction of a copper surface with amine boranes, in particular with dimethylamine borane. Amine borane ($BH_3$) is very stable both in a liquid and in a solid state. Stability, solubiltity, and ease in use, make amine boranes very attractive sources of borane for variety of organochemical reactions.

It is known that heating to 60–70° C. causes decomposition of primary and secondary amine boranes with the formation of covalently bonded aminoboranes:

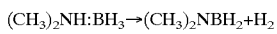

The resulting aminoboranes show a tendency to demirization, and formation of long-chained polymers becomes possible under predetermined conditions. An increase of temperature to 100° C. will significantly accelerate the reaction of decomposition. Tertiary amines possess higher thermal stability. However, even with decomposition they evolve hydrogen:

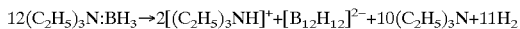

Strong interaction between borane and amine results in high stability of borane amines against hydrolysis. Thus, a 10% aqueous solution of a dimethylamine borane loses only 3% of hydrogen during one month, while a 10% aqueous solution of a dimethylamine borane of high purity does not lose a noticeable amount of hydrogen even after one-year storage.

It can be concluded from the above, that hydrogen obtained in thermal decomposition of dimethylamine borane reduces copper oxides on the surface of a film similar to the action of a hypophosphorous acid ($H_3PO_2$). This particular property explains selective activity of the copper surface in subsequent chemical deposition of transient metals.

Similar chemical processes can be observed in other fields of electroplating technology. Thus, borane amines, in particular, dimethylamine boranes [DMAB][$(CH_3)_2NHBH_3$ are used for treating copper films in the production of printed circuit boards. Multiple methods of reduction of CuO, obtained artificially in appropriate processes, to copper monoxide $Cu_2$ are described also in U.S. Pat. No. 4,642,161.

Bonds between metals and polymeric layers were improved when the surface of copper coated with a thin layer of black copper oxide (Cu II) was reduced by borane amines to brown copper oxide (Cu I) at temperatures from 25° C. to 50° C.

Other amines, such as morpholine borane $C_4H_{12}BNO$, ethylenediamine borane $H_2NCH_2CH_2NH_2BH_3$, ethylene diamine bisborane $H_2NCH_2CH_2NH_22BH_3$, t-butylamine borane $(CH_3)_3CNH_2BH_3$, piperazine borane $C_4H_{10}N_2BH_3$, imidazol borane $C_3H_4N_2BH_3$, and methoexyethylamine borane $C_3H_9NOBH_3$ have also been used as reducing agents (see U.S. Pat. No. 5,750,087).

Thus it has been shown that the present invention provides a method for selective deposition of Co—W—P system films onto copper with palladium-free activation, which is simple and inexpensive, and in which the efficiency of selective deposition of a Co—W—P system films is achieved by forming a hydrogen-rich complexes on the metal surface prior to deposition. The method of the invention excludes an additional step of palladium deposition.

The invention has been shown and described with reference to specific embodiments, which should be construed only as examples and do not limit the scope of practical applications of the invention. Therefore any changes and modification in technological processes, materials, and reactions are possible, provided these changes and modifications do not depart from the scope of the patent claims. For example, the process can be carried with another hydrogen source, or with the use of organic radicals, which will prevent oxidation of copper. The object of the invention can be achieved also with the aqueous hydrogen solutions or solutions of hydrogen in liquid organic compounds. The method of the invention is applicable to any processes in which oxidation of the metal surface in catalytic reactions creates a problem for selectivity of the process. Furthermore, although the following description relates mainly to cobalt-tungsten-phosporus films, it is appreciated that the principle of the invention is applicable to other phosophorus-containing metals such as Co—Ni—P, Co—Mo—P, Ni—W—P, Ni—P, Co—P, Cr—W—P, Cr—P systems, or the like.

What is claimed is:

1. A method for electroless deposition of a phosphorus-containing metal film onto copper having oxides on the copper surface with palladium-free activation, comprising the steps of:

forming complexes with a high level of hydrogen by bringing said copper surface into contact with an aqueous solution of a reducing agent;

forming said complexes on said copper surface thus reducing copper from said oxides and protecting said copper surface from oxidation; and then depositing the phosphorus-containing metal film onto said copper surface by electroless deposition.

2. The method of claim 1, wherein said phosphorus-containing metal film is a cobalt-tungsten-phosphorus film.

3. The method of claim 1, wherein said reducing agent is selected from the group consisting of a hypophosphorous acid and amine boranes.

4. The method of claim 1, where said step of forming said complexes comprises maintaining said aqueous solution within a temperature range from 20° C. to approximately 100° C.

5. The method of claim 1, wherein said step of forming said complexes is carried out during a period of time of less than approximately 1 hour.

6. The method of claim 5, wherein said step of forming said complexes is carried out during a period of time from approximately 5 seconds to approximately 30 seconds.

7. The method of claim 1, further comprising a step of removing said complexes from said copper surface with a rinsing solution thus imparting selective catalytic properties to said copper surface with regard to said phosphorus-containing metal film.

8. The method of claim 7, wherein said rinsing solution is deionized water.

9. The method of claim 2, wherein said copper surface comprises interconnects on an integrated circuit, and wherein the step of depositing comprises a barrier layer on said copper interconnects, said barrier layer being made from said cobalt-tungsten-phosphorus film.

10. The method of claim 1, wherein said phosphorus-containing metal film is made from a metal alloy selected from the group consisting of a nickel-based alloy and a cobalt-based alloy.

11. The method of claim 1, wherein said phosphorus-containing metal film contains tungsten or molybdenum as a second metal component.

12. The method of claim 2, wherein said phosphorus-containing metal film further contains molybdenum.

13. The method of claim 1, wherein the aqueous solution of the reducing agent is distinct from a deposition solution used for the electroless deposition of the phosphorus-containing metal film.

14. A method for electroless deposition of a phosphorus-containing film onto copper, comprising:

exposing a copper surface to a catalytic activation solution comprising a hypophosphorous acid based reducing agent; and subsequently exposing the copper surface to a deposition solution comprising a hypophosphite based reducing agent.

15. The method of claim 14, where the step of exposing the copper surface to the catalytic activation solution comprises maintaining the catalytic activation solution within a temperature range between approximately 20° C. and approximately 100° C.

16. The method of claim 15, where the step of exposing the copper surface to the catalytic activation solution comprises heating the catalytic activation solution to a temperature greater than approximately 85° C.

17. The method of claim 14, wherein the step of exposing the copper surface to the catalytic. activation solution comprises exposing the copper surface to the catalytic activation solution for less than approximately 1 hour.

18. The method of claim 14, wherein the catalytic activation solution is essentially absent of palladium.

19. The method of claim 14, wherein the catalytic activation solution is essentially absent of akali salts.

20. The method of claim 14, wherein the catalytic activation solution comprises an additional source of hydrogen other than the hypophosphorous acid.

21. The method of claim 14, wherein the catalytic activation solution comprises organic radicals.

22. A method for depositing a phosphorus-containing film onto copper, comprising:

treating a copper layer with a catalytic activation solution comprising a borane amine to cause a reduction reaction of oxides formed upon the copper layer; and depositing the phosphorus-containing film onto the treated copper layer using an electroless deposition solution distinct from the catalytic activation solution.

23. The method of claim 22, further comprising removing the catalytic activation solution from the treated copper layer prior to the step of depositing the phosphorus-containing film.

24. The method of claim 23, wherein the step of removing comprises rinsing the treated copper layer with deionized water.

25. The method of claim 21, further comprising heating the catalytic activation solution to a temperature greater than approximately 60° C.

26. The method of claim 25, wherein the step of heating the catalytic activation solution comprises heating the catalytic activation solution to a temperature of approximately 100° C.

27. The method of claim 22, wherein the step of treating the copper layer to the catalytic activation solution causes hydrogen-rich complexes to form upon the copper layer.

* * * * *

UNITED STATES PATENT AND TRADEMARK OFFICE
CERTIFICATE OF CORRECTION

PATENT NO. : 6,794,288 B1
DATED : September 21, 2004
INVENTOR(S) : Kolics et al.

It is certified that error appears in the above-identified patent and that said Letters Patent is hereby corrected as shown below:

<u>Title page,</u>
Item [74], *Attorney, Agent, or Firm*, please delete "Mollie F. Lettang" and insert
-- Mollie E. Lettang --.

Signed and Sealed this

Fifth Day of April, 2005

JON W. DUDAS
*Director of the United States Patent and Trademark Office*